United States Patent
Wang et al.

(10) Patent No.: US 9,813,599 B1
(45) Date of Patent: Nov. 7, 2017

(54) PORTABLE ELECTRONIC DEVICE WITH AN ATTACHABLE IMAGE CAPTURING MODULE

(71) Applicant: Quanta Computer Inc., Taoyuan (TW)

(72) Inventors: Jui-Lung Wang, Taoyuan (TW); Chang-Ta Miao, Taoyuan (TW); Chu-Fu Wang, Taoyuan (TW); Gwo-Chyuan Chen, Taoyuan (TW)

(73) Assignee: Quanta Computer Inc., Taoyuan (TW)

( * ) Notice: Subject to any disclaimer, the term of this patent is extended or adjusted under 35 U.S.C. 154(b) by 0 days.

(21) Appl. No.: 15/367,380

(22) Filed: Dec. 2, 2016

(30) Foreign Application Priority Data

Nov. 15, 2016 (TW) .............................. 105137311 A (51) Int. Cl.
*H04N 5/225* (2006.01)
*H05K 5/02* (2006.01)

(52) U.S. Cl.
CPC ......... *H04N 5/2257* (2013.01); *H04N 5/2252* (2013.01); *H04N 5/2253* (2013.01); *H05K 5/0226* (2013.01)

(58) Field of Classification Search
CPC .... G06F 1/1616; G06F 1/1679; G06F 1/1686; H04N 5/2257; H04N 5/2252; H04N 5/2253; H05K 5/0026
See application file for complete search history.

(56) References Cited

U.S. PATENT DOCUMENTS

| | | | | |
|---|---|---|---|---|
| 6,812,958 B1* | 11/2004 | Silvester | ............... | G06F 1/1607 348/207.1 |
| 9,261,904 B2* | 2/2016 | Liu | ........................ | G06F 1/1613 |
| 2002/0044216 A1* | 4/2002 | Cha | ........................ | G06F 1/1616 348/376 |
| 2005/0076088 A1* | 4/2005 | Kee | ........................ | G06F 1/1616 709/206 |
| 2010/0039763 A1* | 2/2010 | Hsu | ........................ | G06F 1/1616 361/679.26 |
| 2011/0255289 A1* | 10/2011 | Krah | ...................... | G06F 1/1616 362/253 |
| 2014/0254756 A1* | 9/2014 | Tagawa | ................... | H01R 13/62 378/62 |
| 2017/0019588 A1* | 1/2017 | Gordon | .............. | H04N 5/23203 |

FOREIGN PATENT DOCUMENTS

| TW | 459192 B | 10/2001 |
|---|---|---|
| TW | 200825605 A | 6/2008 |

* cited by examiner

*Primary Examiner* — Amy Hsu (57) ABSTRACT

An image capturing module applicable to a portable electronic device is provided. The image capturing module includes an approximately cylindrical casing, an image capturing sensor, an accommodation space, and at least one magnet. The casing includes a first side having a projection, and a second side, opposed to the first side, having a charging contact. The image capturing sensor is disposed on an outer surface of the casing. The accommodation space is disposed in the casing for receiving a battery. The at least one magnet is disposed between the first side of the casing and the accommodation space.

20 Claims, 6 Drawing Sheets

PORTABLE ELECTRONIC DEVICE WITH AN ATTACHABLE IMAGE CAPTURING MODULE

RELATED APPLICATIONS

This application claims priority to Taiwanese Application Serial Number 105137311, filed Nov. 15, 2016, which is herein incorporated by reference.

BACKGROUND

Field

This application relates to an image capturing module and a related portable electronic device, and more particularly to an image capturing module attachable to a hinge of a related portable electronic device.

Background

With the development of technology, one kind of remote controlled image capturing device appears on the market, such as ILCE-QX1 of SONY®, or RE of HTC®. This kind of image capturing devices can be controlled through a remote portable electronic device, such as a laptop or mobile phone. However, the user has to prepare an additional space to store or carry the device when not in use. It is inconvenient to carry such image capturing devices to go outside, which discourages usage of this kind of remote controlled image capturing device.

SUMMARY

It is therefore an objective of the present invention to provide an image capturing module attachable to a hinge of a related portable electronic device to solve the above-noted problem. The user can depend on demand to attach the image capturing module to the hinge or detach the image capturing module from the hinge, which encourages the user to carry the image capturing module for use.

In accordance with a first aspect of the present invention, an image capturing module applicable to a portable electronic device is disclosed. The image capturing module comprises an approximately cylindrical casing, an image capturing sensor, an accommodation space, and at least one magnet. The casing comprises a first side having a projection, and a second side, opposed to the first side, having a charging contact. The image capturing sensor is disposed on an outer surface of the casing. The accommodation space is disposed in the casing for receiving a battery. The at least one magnet is disposed between the first side of the casing and the accommodation space.

In accordance with a second aspect of the present invention, a portable electronic device is disclosed. The portable electronic device comprises a base, a display, and a hinge. The display is rotatable relative to the base. The hinge connects the base to the display device. The hinge comprises an accommodation portion, a fixing portion, and an image capturing module. The fixing portion comprises at least one magnetic element and a charging cable. The image capturing module is rotatable relative to, attachable to, and detachable from the accommodation portion. The image capturing module comprises an approximately cylindrical casing, an image capturing sensor, an accommodation space, and at least one magnet. The casing comprises a first side having a projection, and a second side, opposed to the first side, having a charging contact. The image capturing sensor is disposed on an outer surface of the casing. The accommodation space is disposed in the casing for receiving a battery. The at least one magnet is disposed between the first side of the casing and the accommodation space. When the image capture module is disposed in the accommodation portion, the charging cable corresponds to the charging contact, and the at least one magnet corresponds to the at least one magnetic element.

BRIEF DESCRIPTION OF THE DRAWINGS

These and other sample aspects of the present technology will be described in the detailed description and the appended claims that follow, and in the accompanying drawings, wherein:

DETAILED DESCRIPTION

Figure 1:
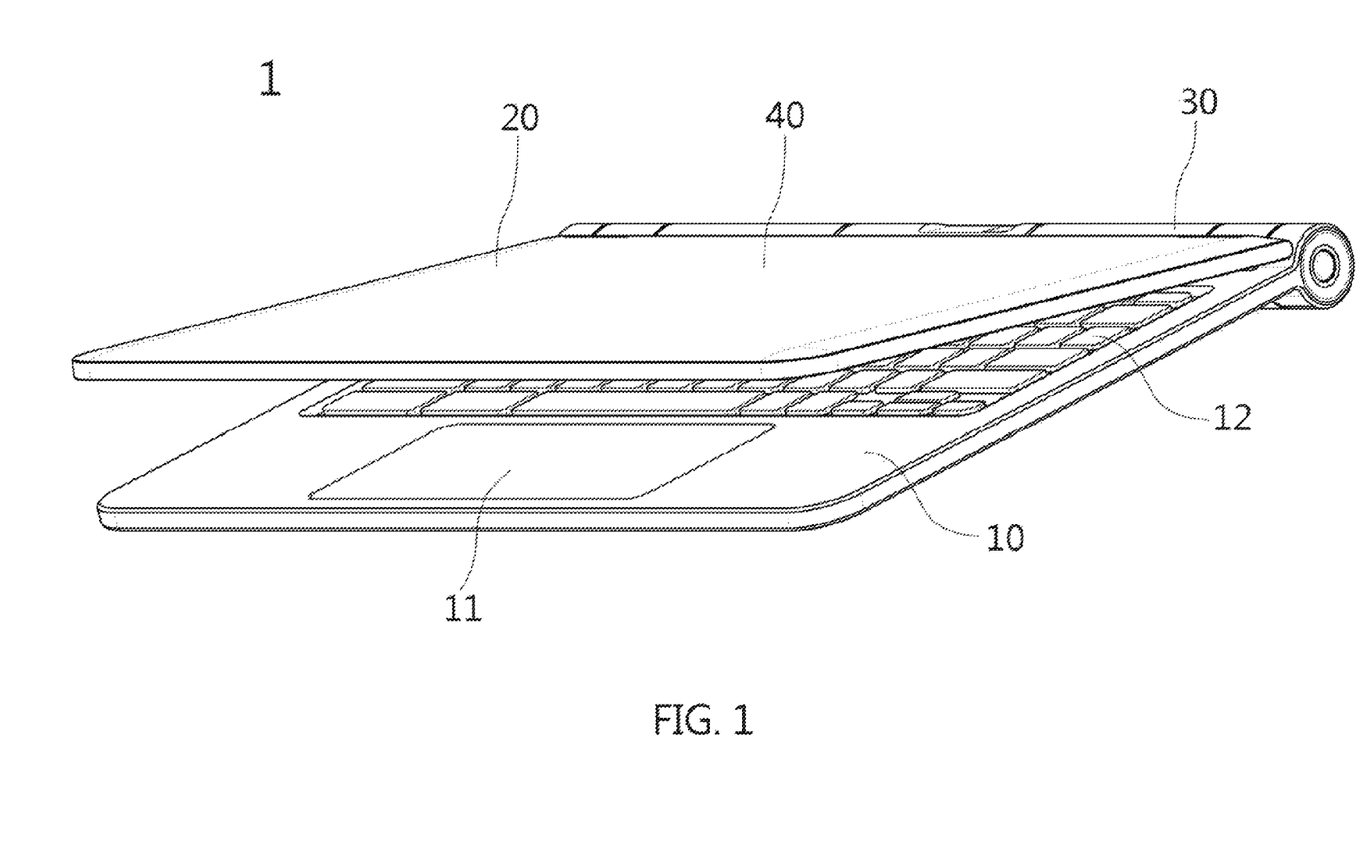
FIG. 1 illustrates a schematic drawing of a portable electronic device having an image capturing module in accordance with an embodiment of the present invention.

FIG. 1 shows a schematic drawing of a portable electronic device having an image capturing module in accordance with an embodiment of the present invention. The portable electronic device 1 includes a base 10, a display device 20, a hinge 30, and an image capturing module 40. The portable electronic device 1 can be a laptop or a mobile phone. The display device 20 can be a monitor for showing information of image or text. The base 10 includes at least one input device, such as a touch pad 11, a track ball or a keyboard 12. Besides, the base 10 or the display device 20 includes a plurality of electronic components, such as processors, memory, battery and storage unit. The hinge 30 connects the base 10 to the display device 20 such that the display 20 can be rotatable relatively to the base 10. The image capturing module 40 is rotatable relatively to, attachable to, and detachable from the hinge 30.

Figure 2:
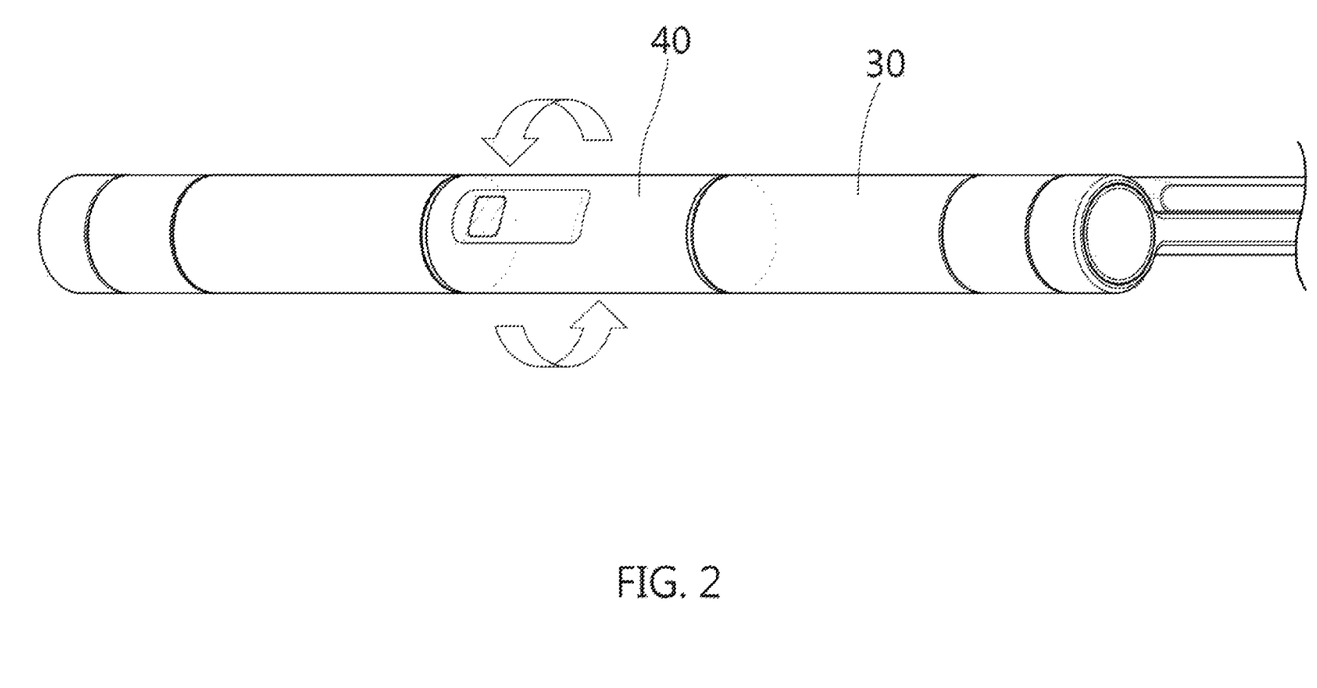
FIG. 2 illustrates a schematic drawing of the image capturing module attached to the hinge in accordance with an embodiment of the present invention.

FIG. 2 shows a schematic drawing of the image capturing module attached to the hinge in accordance with an embodiment of the present invention. As shown in FIG. 2, the image capturing module 40 is attached to approximately the middle portion of the hinge 30, and is 360 degree rotatable relatively to the hinge 30.

Figure 3A:
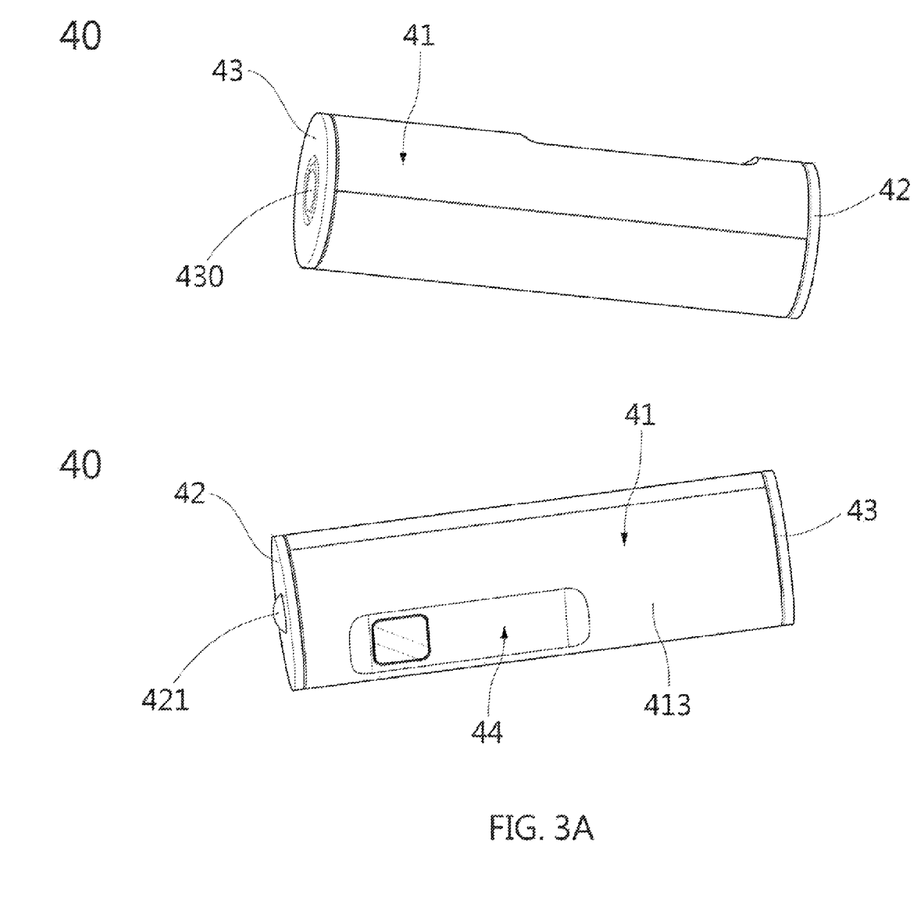
FIG. 3A illustrates two different prospective views of the image capturing module in accordance with an embodiment of the present invention.
Figure 3B:
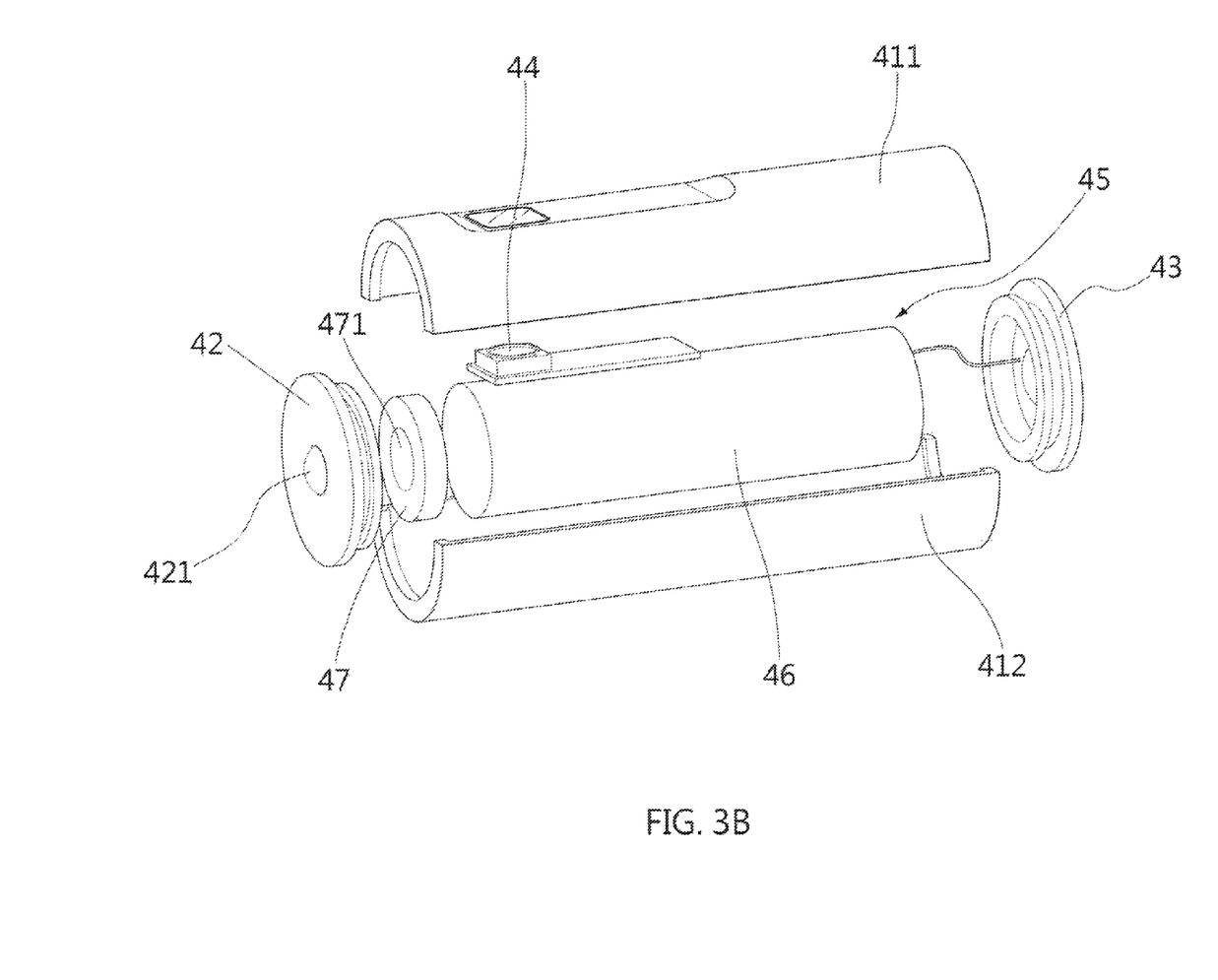
FIG. 3B illustrates an exploded view of the image capturing module in accordance with an embodiment of the present invention.

FIG. 3A shows one prospective view of the image capturing module, and FIG. 3B shows another prospective view of the image capturing module in accordance with an embodiment of the present invention. The image capturing module 40 includes an approximately cylindrical casing 41, an image capturing sensor 44, an accommodation space 45 (shown in FIG. 3B), and at least one magnet 47 (shown in FIG. 3B). The accommodation space 45 is used for receiving a battery 46, making the image capturing module 40 a standalone device that is operable when detached from the portable electronic device 1.

The cylindrical casing 41 comprises a first side 42 and a second side 43, wherein the second side 43 is opposed to the first side 42. The image capturing sensor 44 is disposed on an outer surface of the cylindrical casing 41, between the first side 42 and the second side 43, for capturing images or videos. The magnet 47 is disposed between the first side 42 and the accommodation space 45.

In an embodiment, the image capturing sensor 44 can be a CCD (Charge-coupled Device) or CMOS sensor.

The first side 42 of the cylindrical casing 41 comprises a projection 421, electronically coupled to the image capturing unit 44. The projection 421 not only provides the function of alignment and fool-proofing, but also serves to actuate the image capturing sensor 44 to capture the images while being detached from the hinge 30. The second side 43 of the cylindrical casing 41 comprises a charging contact 430 for charging the battery 46.

In one embodiment, the projection 421 can be an elastic button. In an embodiment, the cylindrical casing 41 comprises an upper casing 411 and a bottom casing 412. When the upper casing 411 is engaged with the bottom casing 412, the cylindrical casing 41 and the accommodation space 45 inside the casing 41 are formed. In an embodiment, the first side 42 and the second side 43 comprise a front cover and a rear cover, respectively, and each one of the front cover and the rear cover could be engaged with or released from the cylindrical casing 41.

Figure 4:
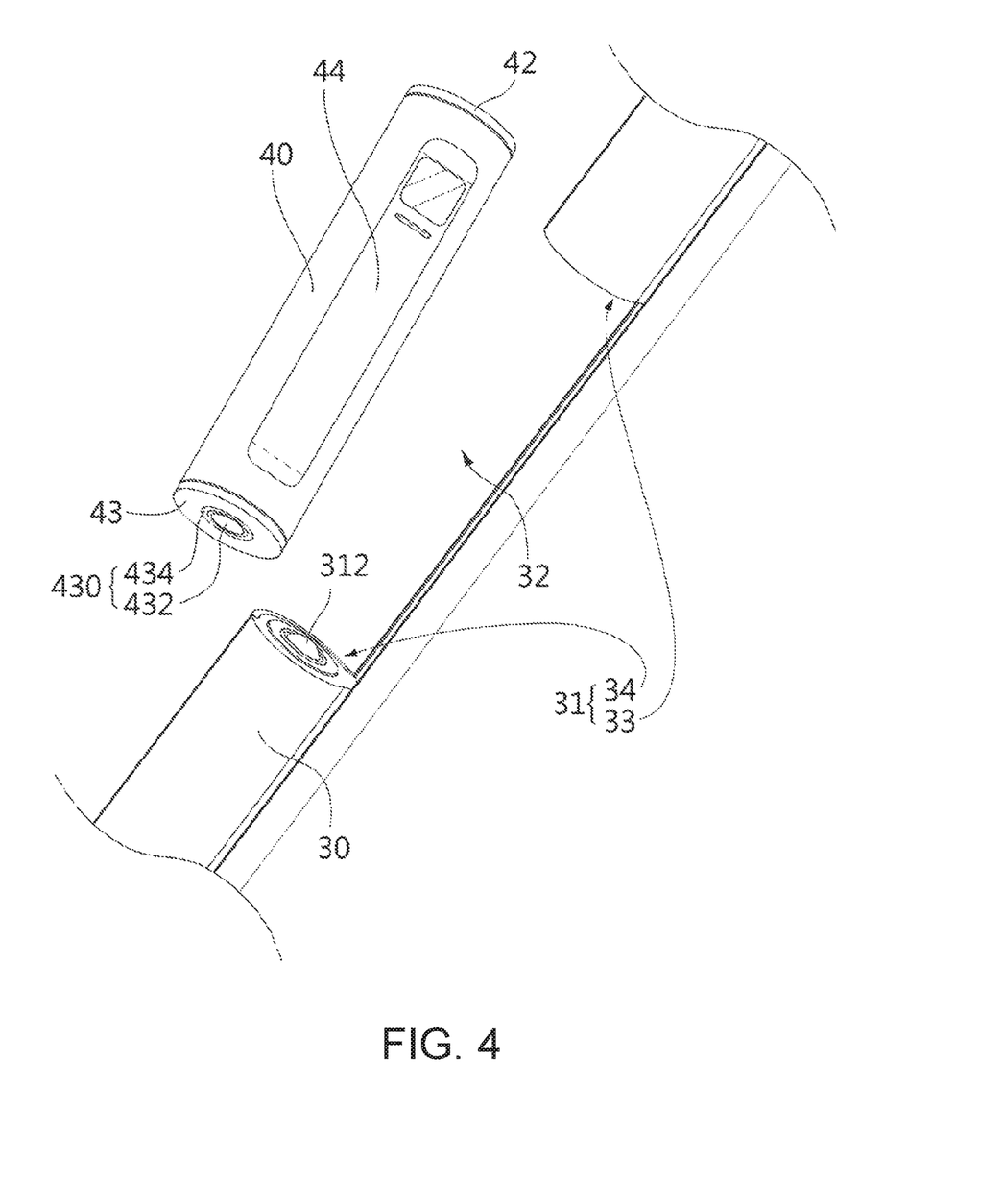
FIG. 4 illustrates a schematic diagram of a charging contact of the image capturing module corresponding to a charging cable of the hinge in accordance with an embodiment of the present invention.

FIG. 4 shows a schematic diagram of the charging contact of the image capturing module corresponding to a charging cable of the hinge in accordance with an embodiment of the present invention. As described above, the second side 43 of the image capturing module 40 comprises the charging contact 430 corresponding to a charging cable 312 of the hinge 30 for charging the battery 46 when the image capturing module 40 is attached to the hinge 30.

Specifically, the hinge 30 includes an accommodation portion 32 and a fixing portion 31 for receiving the image capturing module 40 and make the image capturing module 40 360 degree rotatable relatively to, attachable to, and detachable from the hinge 30. In an embodiment, the fixing portion 31 comprises a first fixing section 33 and a second fixing second 34, and each of the fixing sections 33, 34 is disposed at a corresponding one of the two opposed sides of the accommodation portion 32 to correspond to the first side 42 and the second side 43 of the image capturing module 40, respectively. The first fixing section 33 and the second fixing section 34 are used to firmly fix the image capturing module 40. In an embodiment, the first fixing section 33 comprises at least one magnetic element 310 corresponding to the at least one magnet 47 of the image capturing module 40. In an embodiment, the second fixing section 34 comprises a charging cable 312 corresponding to the charging contact 430 of the image capturing module 40 for charging the battery 46.

In an embodiment, in order to keep the image capturing module 40 with 360 degree rotatable when attached to the accommodation portion 32, the charging contract 430 is in a form of annularity or circle. In an embodiment, the charging contract 430 comprises an anode contact 432 and a cathode contact 434, wherein one charging contact (such as the anode contact 432) can be a circle contact and disposed at the center of the second side 43, and the other charging contact (such as the cathode contact 434) can be an annular contact surrounding the circle contact. Correspondingly, the charging cable 312 can be in such a form to engage with the circle contact and the annular contact.

In an embodiment, the projection 421 also can be in the form of circle, and the magnet 47 which is near the first side 42 can also be in the form of annularity with a circular hole 471 at the center aligned to the projection 421.

In an embodiment, the anode contact 432 and the cathode contact 434 are concentric.

Figure 5:
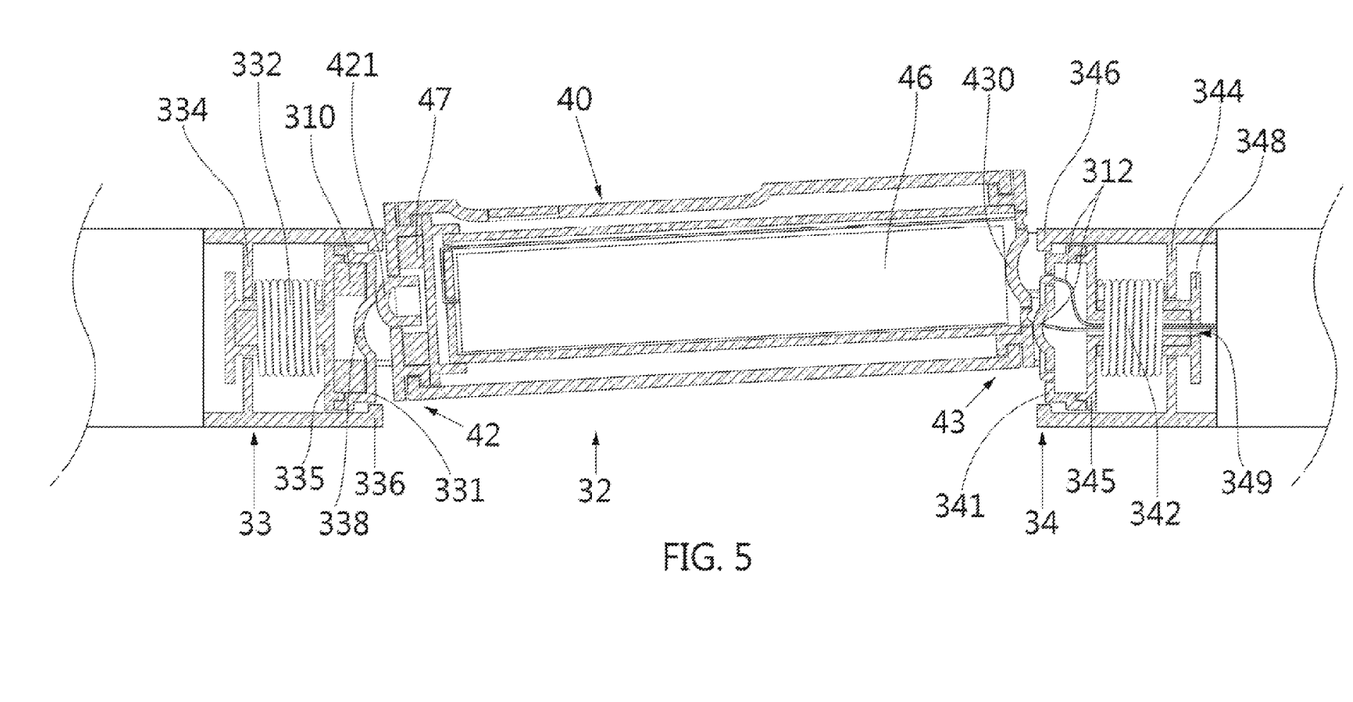
FIG. 5 illustrates a cross-sectional view of the image capturing module attached to the hinge in accordance with an embodiment of the present invention.

FIG. 5 shows a cross-sectional view of the image capturing module attached to the hinge in accordance with an embodiment of the present invention. In the illustrated embodiment, the first fixing section 33 of the hinge 30 comprises a first stop 334, a wall 335, a first movable contact part 331, a second stop 336, a first elastic element 332 and the at least one magnetic element 310. The first stop 334 and the second stop 336 are disposed fixedly while the wall 335 and the first movable contact part 331 are disposed movably. The first movable contact part 331 is located between the wall 335 and the second stop 336; the first elastic element 332 is located between the first stop 334 and the wall 335; and the magnetic element 310 is located between the wall 335 and the first movable contact part 331. When the image capturing module 40 has not yet attached to the accommodation portion 32, the first movable contact part 331 and the second stop 336 are coplanar.

In an embodiment, the central portion of the first movable contact part 331 has a recess 338 engagable with the projection 421. The magnetic element 310 is disposed corresponding to the magnet 47 to generate a magnetic force for quick positioning. In one embodiment, the magnetic element 310 can be in a form of annularity. The first elastic element 332, such as a spring, is used for generating spring force to secure the image capturing module 40.

Similarly, the second fixing section 34 of the hinge 30 comprises a first stop 344, a wall 345, a second movable contact part 341, a second stop 346, and a second elastic element 342. The first stop 344 and the second stop 346 are disposed fixedly while the wall 345 and the first movable contact part 341 are disposed movably. The first movable contact part 341 is located between the wall 345 and the second stop 346; and the second elastic element 342 is located between the first stop 344 and the wall 345. When the image capturing module 40 has not yet attached to the accommodation portion 32, the second movable contact part 341 and the second stop 346 are coplanar.

The second fixing section 34 further comprises an axle seat 348 having a through hole 349. The axle seat 348 penetrates the second elastic element 342, and the second elastic element 342 is disposed between the first stop 344 and the wall 345. The charging cable 312 passes through the axle seat 348 via the through hole 349 such that the charging cable 312 can be electronically coupled to the charging contact 430.

In an embodiment, the profile of the charging contact 430 and the charging cable 312 are designed to correspond to each other for enhancing contact.

Specifically, as shown in FIG. 5, when one end (the first side 42) of the image capturing module 40 is moved toward to the first fixing section 33 of the accommodation portion 32 for attaching, a magnetic force generated between the magnet 47 and the magnetic element 310 will guide the one end (the first side 42) to the correct position, and the projection 421 will slip to fit into the recess 338. Then, in order to attach the other end (the second side 43) of the image capturing module 40 to the accommodation portion 32, all of the first movable contact part 331, the magnetic element 310, the wall 335, and the first elastic element 332 have to be pushed towards the first stop 334. Meanwhile, the first elastic element 332 will generate a first spring force (rebound force) to push the image capturing module 40 back. Both the first force and the magnetic force serve as the clipping or fixing force of the first fixing section 33. Similarly, when the other end (the second side 43) of the image capturing module 40 is attached to the accommodation portion 32, the charging contact 430 and the charging cable 312 will engage with each other; which in turn leads to start the charging process. Simultaneously, the second elastic element 342 will keep providing the second spring force, serving as the clipping or fixing force of the second fixing section 34, to the other end (the second side 43) of the image capturing module 40.

In one embodiment, when the image capturing module 40 is attached in the fixing portion 31, the first spring force of the first elastic element 332 applied to the image capturing module 40 plus the magnetic force generated between the at least one magnet 47 and the at least one magnetic element 310 approximately equal to the second force of the second elastic element 342 applied to the image capturing module 40.

In one embodiment, in order to prevent the image capturing module 40 from being detached from the hinge too easily, the surface of the accommodation portion 32, or the surface of the fixing portion 31 (i.e., the first fixing section 33 and the second fixing section 34) contacting the accommodation portion 32 can be provided with friction pieces, such as PVC (PolyVinyl Chloride) pads.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

The invention claimed is:

1. An image capturing module comprising:
   an approximately cylindrical casing, wherein a first side of the approximately cylindrical casing comprises a projection, and a second side of the approximately cylindrical casing, opposed to the first side, comprises a charging contact;
   an image capturing sensor, disposed on an outer surface of the approximately cylindrical casing;
   an accommodation space for receiving a battery, disposed in the approximately cylindrical casing; and
   at least one magnet, disposed between the first side of the approximately cylindrical casing and the accommodation space.

2. The image capturing module of claim 1, wherein the charging contact is in a form of annularity or circle.

3. The image capturing module of claim 2, wherein the charging contact comprises an anode contact and a cathode contact, and both the anode contact and the cathode contact are concentric.

4. The image capturing module of claim 1, wherein the approximately cylindrical casing comprises an upper casing and a lower casing, the first side of the approximately cylindrical casing comprises a front cover, and the second side of the approximately cylindrical casing comprises a rear cover.

5. The image capturing module of claim 1, wherein the projection is elastic.

6. The image capturing module of claim 5, wherein the projection is coupled to the image capturing sensor and is configured to actuate the image capturing sensor to capture an image.

7. The image capturing module of claim 1, wherein the at least one magnet is in a form of annularity and a circular hole of the at least one magnet is aligned with the projection.

8. A portable electronic device comprising:
   a base;
   a display device rotatable relative to the base; and
   a hinge connecting the base to the display device, the hinge comprising:
     an accommodation portion;
     a fixing portion comprising at least one magnetic element and a charging cable; and
     an image capturing module being rotatable relative to, attachable to, and detachable from the accommodation portion, the image capturing module comprising:
       an approximately cylindrical casing, wherein a first side of the approximately cylindrical casing comprises a projection, and a second side of the approximately cylindrical casing, opposed to the first side, comprises a charging contact;
       an image capturing sensor, disposed on an outer surface of the approximately cylindrical casing;
       an accommodation space for receiving a battery, disposed in the approximately cylindrical casing; and
       at least one magnet disposed between the first side of the approximately cylindrical casing and the accommodation space;
   wherein when the image capture module is disposed in the accommodation portion, the charging cable corresponds to the charging contact, and the at least one magnet corresponds to the at least one magnetic element.

9. The portable electronic device of claim 8, wherein the charging contact is in a form of annularity or circle.

10. The portable electronic device of claim 9, wherein the charging contact comprises an anode contact and a cathode contact, and both the anode contact and the cathode contact are concentric.

11. The portable electronic device of claim 8, wherein the projection is coupled to the image capturing sensor and is configured to actuate the image capturing sensor to capture an image.

12. The portable electronic device of claim 8, wherein the at least one magnet is in a form of annularity and a circular hole of the at least one magnet is aligned with the projection.

13. The portable electronic device of claim 8, wherein the fixing portion further comprises:
   a first fixing section, disposed at one side of the accommodation portion, wherein the first fixing section comprises a first elastic element, and
   a second fixing section, disposed at other side of the accommodation portion, wherein the second fixing section comprises a second elastic element,
   wherein when the image capturing module is attached in the fixing portion, a force of the first elastic element applied to the image capturing module plus a force generated between the at least one magnet and the at least one magnetic element approximately equal to a force of the second elastic element applied to the image capturing module.

14. The portable electronic device of claim 13, wherein the second fixing section further comprises an axle seat penetrating through the second elastic element, the axle seat comprises a through hole, and the charging cable passes through the axle seat via the through hole.

15. The portable electronic device of claim 13, wherein each of the first fixing section and the second fixing section comprises a wall, a first stop and a second stop;
   wherein the first elastic element and the second elastic element are disposed between the wall and the first stop of the first fixing section and between the wall and the first stop of the second fixing section respectively.

16. The portable electronic device of claim 15, wherein the first fixing section further comprises a first movable contact part disposed between the at least one magnetic element and the second stop of the first fixing section, and the at least one magnetic element is disposed between the wall and the first movable contact part of the first fixing section.

17. The portable electronic device of claim 16, wherein the first movable contact part comprises a recess corresponding to the projection.

18. The portable electronic device of claim 15, wherein the second fixing section further comprises a second movable contact part disposed between the wall and the second stop of the second fixing section.

19. The portable electronic device of claim 8, wherein the accommodation portion comprises a friction piece.

20. The portable electronic device of claim 8, wherein the image capturing module is 360 degree rotatable relatively to the hinge when the image capturing module is attached in the accommodation portion.

* * * * *